United States Patent [19]
Yakushiji

[11] Patent Number: 4,942,446
[45] Date of Patent: Jul. 17, 1990

[54] SEMICONDUCTOR DEVICE FOR SWITCHING, AND THE MANUFACTURING METHOD THEREFOR

[75] Inventor: Shigenori Yakushiji, Yokohama, Japan

[73] Assignee: Kabushiki Kaisha Toshiba, Kawasaki, Japan

[21] Appl. No.: 285,304

[22] Filed: Dec. 15, 1988

Related U.S. Application Data

[63] Continuation of Ser. No. 10,734, Feb. 4, 1987, abandoned.

[30] Foreign Application Priority Data

Feb. 27, 1986 [JP] Japan ................. 61-42257

[51] Int. Cl.⁵ ........................................... H01L 29/74
[52] U.S. Cl. ....................................... 357/38; 357/49; 357/51; 357/53; 357/59
[58] Field of Search ................. 357/51, 53, 59, 38, 357/49

[56] References Cited

U.S. PATENT DOCUMENTS 4,016,592 4/1977 Yatsuo et al. ............... 357/38
4,157,563 6/1979 Bosselaar ................... 357/53
4,691,223 9/1987 Murakami et al. ........... 357/38

FOREIGN PATENT DOCUMENTS 3520599 12/1985 Fed. Rep. of Germany.
56-105673 8/1981 Japan.
60-4261 1/1985 Japan.

OTHER PUBLICATIONS

Patent Abstracts of Japan, vol. 5, No. 179 (E-82) [851], Nov. 17, 1981; and JP-A-56 105 673 (Nippon Denki K.K.) 8-22-81.
Patent Abstracts of Japan, vol. 8, No. 176 (E-260) [11613], Aug. 14, 1984; and JP-A-59 695 970 (NEC Home Electronics K.K.) 4-20-84.

Primary Examiner—Joseph E. Clawson, Jr.
Attorney, Agent, or Firm—Finnegan, Henderson Farabow, Garrett, and Dunner

[57] ABSTRACT

In a thyristor to which a semiconductor device according to the present invention is applied, at least one p-n junction is exposed at one surface of a semiconductor substrate, a polysilicon field plate is formed, via an insulating film, over the p-n junction of the semiconductor substrate and a gate region formed therein, so that the exposed portion of the p-n junction is covered by the field plate, and two specific regions of the field plate are electrically connected to the gate region and cathode region to form a gate-cathode resistance between the gate region and the cathode region. The resistance of the polysilicon field plate, inserted between the gate region and the cathode region, can be determined by the length of the polysilicon field plate therebetween and/or the concentration of an impurity in the polysilicon field plate therebetween.

4 Claims, 4 Drawing Sheets

SEMICONDUCTOR DEVICE FOR SWITCHING, AND THE MANUFACTURING METHOD THEREFOR

This application is a continuation of application Ser. No. 010,734 filed Feb. 4, 1987, now abandoned.

BACKGROUND OF THE INVENTION

The present invention relates to a semiconductor device for switching, such as a thyristor, and a manufacturing method therefor.

A planar thyristor or the like is known as a typical semiconductor device for switching. A planar thyristor is superior to a mesa thyristor in terms of reliability, yield, ease of handling, and the like. However, a planar thyristor has a smaller electrical capacity (e.g., a withstand voltage and a maximum switching current) than a mesa thyristor. This drawback is due to poor yield when a planar thyristor of a large capacity, having an enlarged area for a switching element pellet is manufactured by a conventional technique. However, as current wafers now have larger diameters, a planar thyristor having a high withstand voltage, and high reliability has consequently become desirable. Among these characteristics, a high withstand voltage can be realized by moderating the rise of the surface electric field on a p-n junction, by means of a field plate structure. In this case, the increase in pellet size is negligible. However, in order to enhance the reliability of such a thyristor, erroneous firing at high temperature must be prevented, and a suitable resistance must be provided between the gate and cathode of the thyristor. Such a resistance also serves to provide a constant fire sensitivity of the thyristor. This resistance can be formed by means of a diffusion resistor or polysilicon resistor. However, in either case, the pellet size is enlarged, as a whole, if the resistance is added to a conventional thyristor structure.

SUMMARY OF THE INVENTION

It is accordingly an object of the present invention to provide a semiconductor device in which a high withstand voltage and constant element sensitivity (fire sensitivity) can be obtained substantially without enlarging pellet size, and a manufacturing method therefor.

In order to achieve the above object, when a semiconductor device of the present invention is applied to, for example, a thyristor, at least one major junction is exposed at one surface of a semiconductor substrate to which the thyristor is formed, a polysilicon layer (a field plate) is formed, via an insulating film, over the major junction formed by the semiconductor substrate and the gate region, so as to cover an exposed portion of the major junction, and two specific regions of the polysilicon layer are electrically connected to the gate and cathode regions, to form a gate-cathode resistor.

In the above structure, the resistance of the polysilicon layer, inserted between the gate and cathode regions, can be determined by the length of, and/or the concentration of an impurity in, the polysilicon layer between the two regions.

In the above-mentioned semiconductor device, a shunt resistance ($R_{gk}$) of the polysilicon layer, which also serves as the field plate, is inserted between the gate and cathode of the thyristor. Therefore, the withstand voltage and the reliability (less erroneous firing) of the thyristor can be improved without enlarging the pellet size.

BRIEF DESCRIPTION OF THE DRAWINGS

FIGS. 3A to 3G are sectional views showing a manufacturing process of the thyristor of FIG. 1, in which:

FIG. 3A shows an n-type Si wafer (20);

FIG. 3B shows a state in which SiO$_2$ films (25, 250) are formed on both surfaces of the wafer of FIG. 3A, followed by a diffusion hole being opened in the film, to form a p-type isolation region (21) by means of diffusion;

FIG. 3C shows a state in which a diffusion hole is opened in the upper SiO$_2$ film of FIG. 3B, to form a p-type base (gate) region (23) by means of diffusion, and wherein the lower SiO$_2$ film is removed to form a p$^+$-type anode region (22) by means of diffusion;

FIG. 3D shows a state in which SiO$_2$ films (25, 250) are formed again on both surfaces of the wafer of FIG. 3C, and wherein a diffusion hole is then opened in the upper SiO$_2$ film, to form an n-type cathode region (24) by means of diffusion;

FIG. 3E shows a state in which the opening of the upper SiO$_2$ film is closed by an SiO$_2$ film and wherein the SiO$_2$ film on regions (21) and (23) is then opened to form a polysilicon layer (27) thereon;

FIG. 3F shows a state in which the polysilicon layer and the SiO$_2$ film are partially removed to form field plates (27, 30); and FIG. 3G shows a state in which the lower SiO$_2$ film (250) is removed and wherein a cathode electrode (28), a gate electrode (29), and an anode electrode (31) are then formed, at predetermined positions, on the upper and lower surfaces of the wafer, by deposition of, for example, aluminum;

DETAILED DESCRIPTION OF THE PREFERRED EMBODIMENTS

Figure 1:
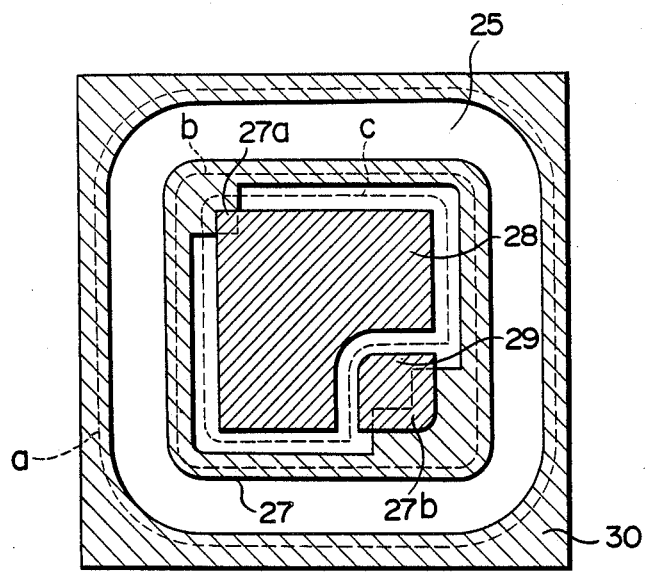
FIG. 1 is a plan view of a thyristor according to one embodiment of the present invention.
Figure 2:
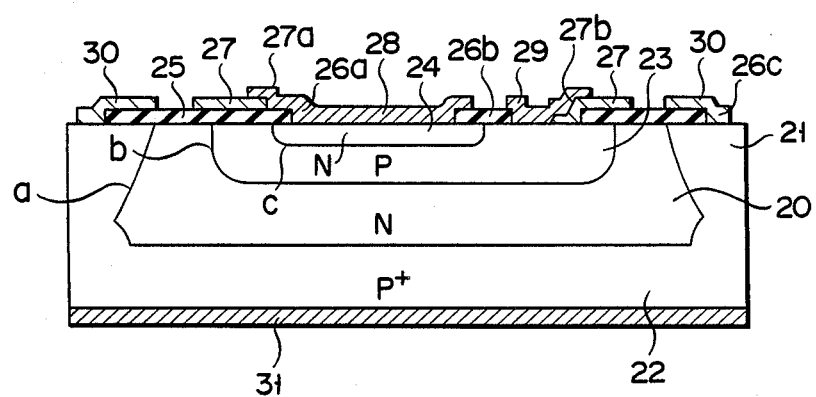
FIG. 2 is a sectional view of the thyristor shown in FIG. 1.
Figure 3A:
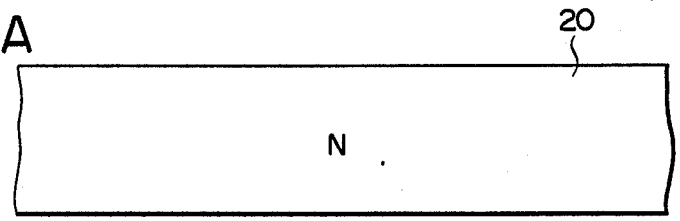
Figure 3B:
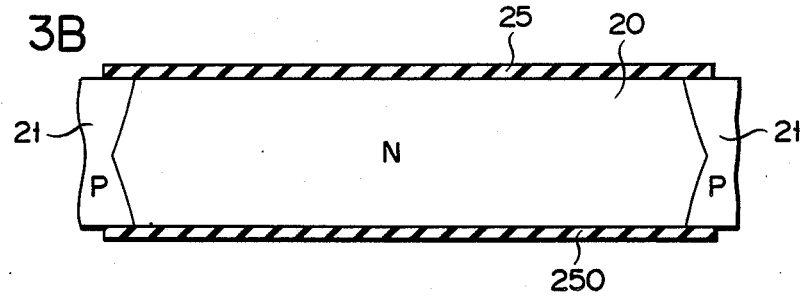
Figure 3C:
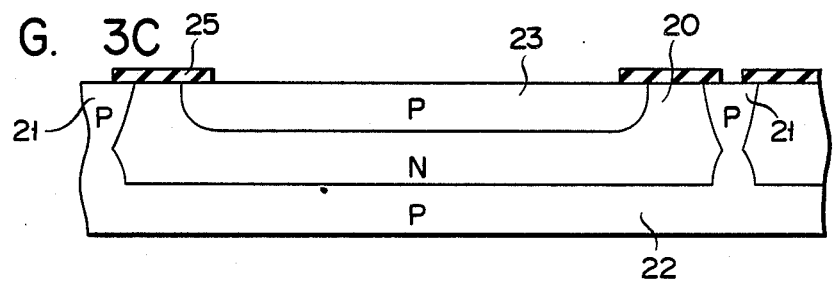

Embodiments of the present invention will now be described in detail, with reference to the drawings. FIG. 1 is a plan view for explaining the structure of a thyristor according to an embodiment of the present invention, and FIG. 2 is a sectional view of the embodiment shown in FIG. 1. FIGS. 3A to 3G are sectional views explaining a manufacturing process of the thyristor shown in FIG. 1. In FIG. 3A, reference numeral 20 denotes an n-type semiconductor substrate made of silicon and having a resistivity of, for example, 40 Ω·cm. Substrate 20 is surrounded by p-type element-isolation region 21 formed, as is shown in FIG. 3B, by means of diffusion, using SiO$_2$ films 25 and 250 as masks. Then, as is shown in FIG. 3C, film 250 is removed and p-type anode region 22 is formed integrally with region 21, by means of diffusion. Note that the p-type concentration of region 22 is higher than that of region 21. Using film 25 as a mask, p-type base region 23 is diffused into the major surface (the upper surface in FIG. 3C) of substrate 20 to form a diffusion depth of about 40 μm. Region 23 is formed, for example, such that a p-type impurity such as boron is adhered to substrate 20, by annealing the substrate at a temperature of 1,000° C. for about an hour, and is then diffused into substrate 20 by annealing it for a longer time.

Figure 3D:
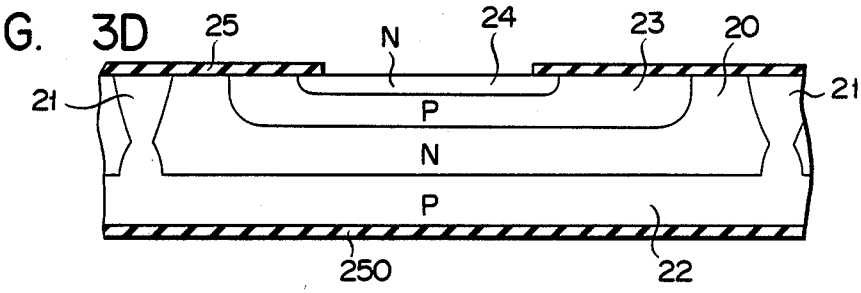

As is shown in FIG. 3D, after the entire lower surface of substrate 20 is covered with SiO₂ film 250, n-type cathode region 24, having a diffusion depth of about 12 μm, is formed in region 23, using film 25 on the upper surface as a mask. Region 24 is formed, for example, such that an n-type impurity such as phosphorus is adhered to the surface of substrate 20, by annealing the substrate at a temperature of 1,100° C. for about 30 minutes, and is then diffused into region 24 by annealing it for a longer time.

Figure 3E:
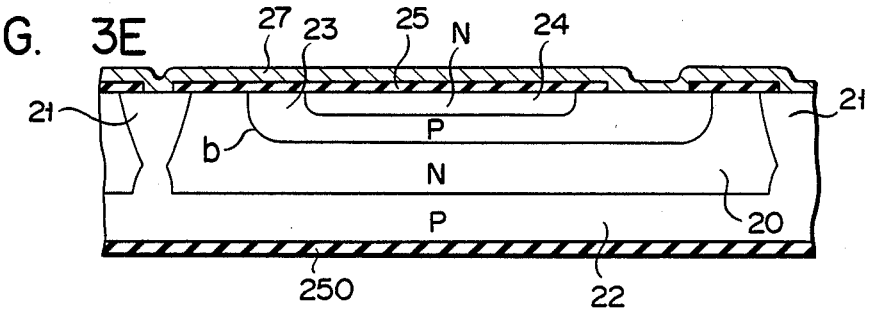

Openings (26a, 26b, and 26c in FIG. 2), respectively connected to regions 24, 23, and 21, are provided in film 25 formed on the major surface (upper surface) of substrate 20 including regions 24, 23, and 21 as shown in FIG. 3E. Subsequently, polysilicon layer 27 is formed, via film 25, over an exposed interface of p-n junction b, formed by region 23 and substrate 20, and over the p-n junction (a) formed by region 21 and substrate 20.

Figure 3F:
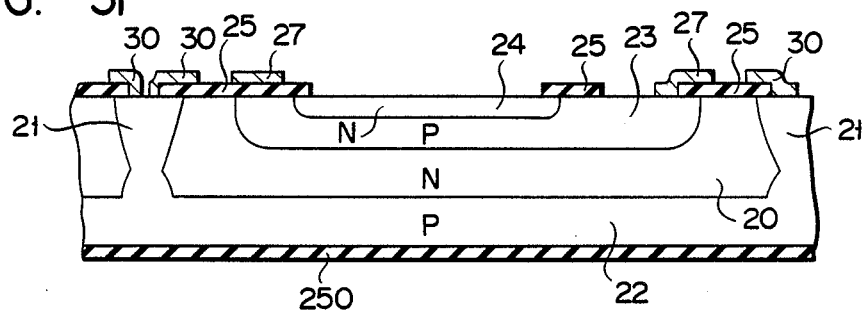

Then, as is shown in FIG. 3F, unnecessary portions of layer 27 are selectively etched by photoetching, to form polysilicon field plates 30 and 27 respectively on p-n junctions a and b, via film 25 (cf. FIG. 1).

Figure 3G:
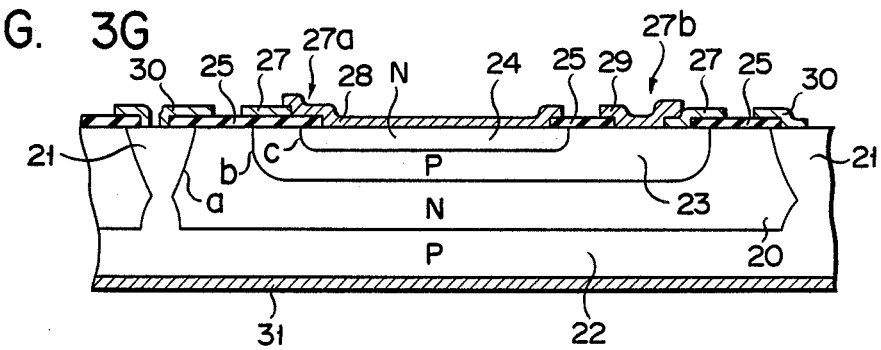

After the SiO₂ film (250 in FIG. 3F) provided at the lower side of the substrate is removed, a metal such as Al or Au is deposited to form cathode electrode 28, gate electrode 29, and anode electrode 31, using a suitable mask (not shown), as is shown in FIG. 3G. In this step, a predetermined portion (27a in FIG. 1 or 2) of plate 27 is connected to electrode 28 on region 24, another predetermined portion (27b) of plate 27 is connected to electrode 29 on region 23. In addition, plate 30 is connected to region 21, through opening 26c (FIG. 2). Note that the thickness of layers 27 and 30 is set to be about 5,000 Å, and these layers are light-transmissible. Plates 27 and 30 are doped with boron at a dose of, for example, $1.6 \times 10^{14}/cm^2$, and is then annealed at a temperature of 1,000° to 1,100° C., for about an hour. With this treatment, a sheet resistance of about 5.2 kΩ/□ for layers 27 and 30, and a gate-cathode resistance ($R_{gk}$) of about 27 kΩ between electrodes 29 and 28, formed by layer 27, are obtained. Note that in this case, the length of one side of the square figure of layer 27 is set to be about 570 μm, and its width is set to be about 110 μm.

In the thyristor having the above arrangement, gate-cathode resistance ($R_{gk}$) can be freely set to a prescribed value, and variations in $R_{gk}$, due to mass-production, will be much smaller than those of the gate trigger current of a single thyristor element. When $R_{gk}$ with small variations in its resistance is connected in parallel between the gate and cathode, so that a current flowing into $R_{gk}$ is much larger than a gate trigger current of the thyristor, and when the thyristor is turned on, variations in the gate trigger sensitivity of the thyristor, having $R_{gk}$, can be controlled to as be low as those in $R_{gk}$.

Note that the gate trigger current of a thyristor is generally several tens μA to several hundreds μA. When the thyristor is in a turned-off state under high temperature, the gate leak current of the main junction of the thyristor could be the order of several tens to several hundreds μA. Consequently, if $R_{gk}$ is not provided, the thyristor could be mis-triggered by a gate leak current under high temperature. The use of $R_{gk}$ can prevent such mistriggering. Because certain part of the gate trigger current is bypassed to $R_{gk}$ so that an actual gate trigger current becomes several mA, to thereby prevent the mistriggering.

Furthermore, layer 27 serving as resistance $R_{gk}$ is provided near the p-n junction of regions 23 and 24, to serve also as a field plate. This field plate serves to enlarge the depletion layer which tends to become narrow near the semiconductor pellet surface. For this reason, the thyristor can have a high withstand voltage without the need to form an independent field plate in addition to $R_{gk}$ described above. More specifically, in the thyristor of the present invention, since the surface electric field intensity of the p-n junction, formed under field plate 27 having the same potential as that of the cathode, is weakened by plate 27, a high withstand voltage can be obtained. If an independent field plate is used separately from $R_{gk}$, the pellet size of the thyristor is inconveniently enlarged.

As has been described above, in a thyristor according to the present invention, a high withstand voltage and a constant sensitivity can be obtained, erroneous firing can be prevented, to thereby improve reliability, and an increase in pellet size can be prevented. In addition, resistance $R_{gk}$ is connected in parallel between the gate and cathode, so that the gate trigger characteristic can be set at a specific value based on the resistance value.

Moreover, although not shown, an insulating film (SiO₂) may be formed on layers 27 and 30, by exposing layers 27 and 30 in an oxidation atmosphere, after formation of these layers, so that any spark discharge, which sometimes occurs between opposing electrodes, can be restricted up to a high voltage.

Figure 4:
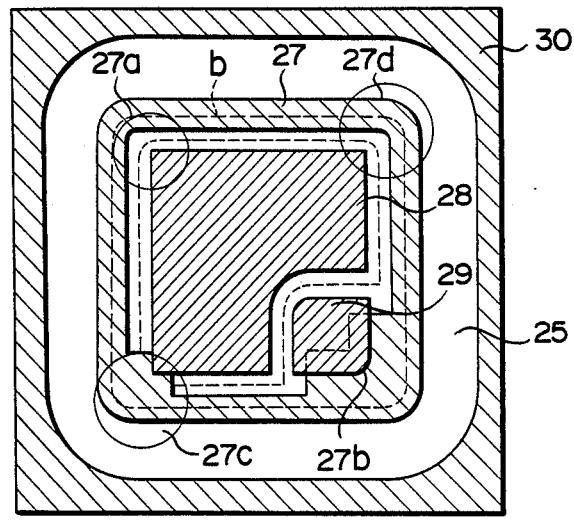
FIG. 4 is a plan view of a modification of FIG. 1, in which the positions of the connecting portions (27c, 27b) between the field plate (27) and cathode electrode (28) are different from those of FIG. 1.

Note that as shown in FIG. 4, the connecting point of plate 27 and electrode 28 can be set at another corner 27c (or 27d) of electrode 28 or at another region, instead of point 27a farthest from electrode 29 as in the embodiment of FIG. 1, and resistance $R_{gk}$ can be set to be a prescribed value in accordance with the length of layer 27 which is to be connected both to electrodes 27 and 28.

Assuming that the resistance per one side of square layer 27 of the embodiment of FIG. 1 is $R_1$, then, when electrode 28 is connected to one point (27c or 27d) of the corners of layer 27, as is shown in FIG. 4, resistance $R_{gk}$ is obtained by the following equation (1):

$$R_{gk} = 3R_1/(3R_1 + R_1) = 3R_1/4 \quad \ldots (1)$$

When layer 27 and electrode 28 are connected at farthest point 27a of layer 27, as is shown in FIG. 1, resistance $R_{gk}$ is $R_1$. Thus, a gate-cathode resistance can be easily controlled by the pattern of layer 27.

Figure 5:
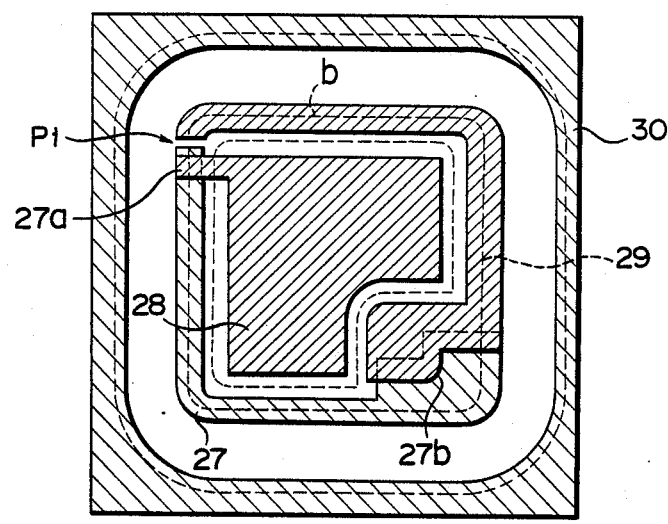
FIG. 5 is a plan view of another modification of FIG. 1, in which a field plate is formed by the polysilicon layer (27) and gate electrode (29), and a portion (P1) of the field plate is cut.
Figure 6:
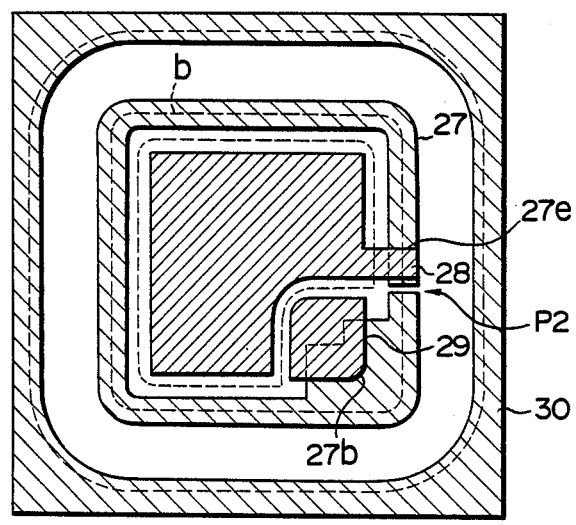
FIG. 6 is a plan view of still another modification of FIG. 1, in which the position of a connecting portion (27e) between the field plate (27) and cathode electrode (28) is different from that of FIG. 1, and a portion (P2) of the field plate is cut.

Note that when a practically sufficient withstand voltage of p-n junction b can be obtained even if a cut portion is provided in the field plate, modifications as shown in FIGS. 5 and 6 can be made.

FIG. 5 shows a case in which one half of the field plate is formed by extended metal electrode 29, and the other half is formed by polysilicon layer 27. Electrode 29 is separated from layer 27 at point P1, so that electrodes 28 and 29 are not short-circuited by the metal electrode layer. If the distance between layer 27 and electrode 29 at point P1 is small enough, a decrease in the withstand voltage of the p-n junction under point P1 can be avoided. Note that in this embodiment, if the resistance per one side of L-shaped layer 27 is $R_1$, then, $R_{gk} \simeq 2R_1$.

FIG. 6 shows a case in which cathode electrode connecting point 27e and gate electrode connecting point 27b are formed close to each other, but they are separated by point P2, so as to elongate the effective length of layer 27 between points 27e and 27b. In this embodiment, when the resistance per one side of square layer 27 is $R_1$, $R_{gk}$ is slightly smaller than $4R_1$. In order to prevent the withstand voltage of the p-n junction under point P2 becoming lower than that of the p-n junction under plate 27, the width of point P2 is set as narrow as possible.

As has been described above, according to the semiconductor device of the present invention, the withstand voltage and reliability can be improved without enlarging the pellet size.

Note that in FIG. 2, if layer 22 is $n^+$-type instead of $p^+$-type, the structure shown in FIG. 2 is an npn bipolar transistor (in this case, reference numeral 28 denotes an emitter; 29, a base; and 31, a collector).

What is claimed is:

1. A semiconductor device comprising:
    a semiconductor substrate region of a first conductivity type surrounded by an element-isolation region;
    a first semiconductor diffused base region of a second conductivity type formed in said semiconductor substrate region and forming a first p-n junction exposed at one surface of said semiconductor substrate region;
    an anode region of a second conductivity type formed integrally with said element-isolation region and forming a second p-n junction exposed at said one surface of said semiconductor substrate region at a location different from that of said first p-n junction;
    an anode electrode connected to said anode region;
    a second semiconductor diffused cathode region of the first conductivity type formed in said first semiconductor region, said second semiconductor region being separated by said first semiconductor region from said semiconductor substrate region;
    an insulating film formed on said one surface of said semiconductor substrate region; and
    a first conductivity layer covering said exposed first p-n junction via said insulating film, said first conductive layer having a first portion and a second portion, with a predetermined electric resistance between said first and second portions, said first portion being electrically connected to said first semiconductor region via a gate electrode, and said second portion being electrically connected to said second semiconductor region via a cathode electrode, wherein said first portion and said second portion are positioned on said first conductive layer in relative spaced-apart relation with a portion of said first p-n junction being covered by said first conductive layer and a remaining portion thereof being covered with an electrode connected to one of said first and second portions; and
    a second conductive layer covering said exposed second p-n junction via said insulating film and electrically connected to said element isolation region.

2. The device according to claim 1, wherein said first portion and said second portion are positioned on said first conductive layer in relative spaced-apart relation a distance less than said substantially maximum distance along said predetermined electrical resistance path on said first conductive layer.

3. The device according to claim 1, wherein said gate electrode has an extended portion having an end separated from said first conductive layer.

4. The device according to claim 1, wherein said first portion and said second portion are positioned on said first conductive layer in relative spaced-apart relation a distance less than said substantially maximum distance along said predetermined electrical resistance path on said first conductive layer, with said first conductive layer having a separated portion between said first and second portions thereof.

* * * * *